(12) United States Patent
Urciuoli

(10) Patent No.: US 9,755,630 B2
(45) Date of Patent: Sep. 5, 2017

(54) SOLID-STATE CIRCUIT BREAKERS AND RELATED CIRCUITS

(71) Applicant: U.S. Army Research Laboratory ATTN: RDRL-LOC-1, Adelphi, MD (US)

(72) Inventor: Damian P. Urciuoli, Bowie, MD (US)

(73) Assignee: The United States of America as represented by the Secretary of the Government, Washington, DC (US)

( * ) Notice: Subject to any disclaimer, the term of this patent is extended or adjusted under 35 U.S.C. 154(b) by 1100 days.

(21) Appl. No.: 13/752,956

(22) Filed: Jan. 29, 2013

(65) Prior Publication Data

US 2013/0154391 A1 Jun. 20, 2013

Related U.S. Application Data

(63) Continuation-in-part of application No. 13/017,227, filed on Jan. 31, 2011, now Pat. No. 8,729,739, which
(Continued)

(51) Int. Cl.
| | |
|---|---|
| *B23K 11/24* | (2006.01) |
| *H02B 1/24* | (2006.01) |
| *H03K 17/081* | (2006.01) |
| *H04M 1/00* | (2006.01) |
| *H04M 11/00* | (2006.01) |

(Continued)

(52) U.S. Cl.
CPC ............ *H03K 17/081* (2013.01); *H02M 1/32* (2013.01); *H03K 17/6874* (2013.01); *H04M 1/00* (2013.01); *H04M 11/00* (2013.01); *H01L 29/1602* (2013.01); *H01L 29/1608* (2013.01); *H01L 29/2003* (2013.01);
(Continued)

(58) Field of Classification Search
CPC ...... B23K 11/248; B23K 11/24; H02M 3/335; H03K 17/687; H03K 17/00; H02H 9/02
USPC ........ 307/112, 77, 32, 55; 330/277, 51, 107, 330/306; 257/723, 107, 173, 263; 361/56, 57
See application file for complete search history.

(56) References Cited

U.S. PATENT DOCUMENTS

| | | | |
|---|---|---|---|
| 4,491,750 A * | 1/1985 | Janutka | H03K 17/102 327/436 |
| 4,571,606 A | 2/1986 | Benjamin et al. | |

(Continued)

OTHER PUBLICATIONS

Magnus Willander et al., "Silicon carbide and diamond for high temperature device applications," Journal of Materials Science: Materials in Electronics 17 (2006) 1-25.
(Continued)

*Primary Examiner* — Rexford Barnie
*Assistant Examiner* — Jagdeep Dhillon
(74) *Attorney, Agent, or Firm* — Eric Brett Compton

(57) ABSTRACT

Various solid-state circuit breakers and related circuits are presented herein. These include, among other things, a common node bidirectional solid-state circuit breaker (BDSSCB) having diodes connected between terminals of its switches, a shunt voltage actuated driver (SVAD) circuit for use with a BDSSCB, a SVAD circuit for use with a unidirectional solid-state circuit breaker (UDSSCB), a bipolar current actuated driver (BCAD) for use with a BDSSCB, and a multi-directional solid-state circuit breaker (MDSSCB).

15 Claims, 10 Drawing Sheets

Related U.S. Application Data is a continuation-in-part of application No. 12/768,898, filed on Apr. 28, 2010, now Pat. No. 8,742,628.

(60) Provisional application No. 61/174,129, filed on Apr. 30, 2009.

(51) Int. Cl.

| | |
|---|---|
| *H02M 1/32* | (2007.01) |
| *H03K 17/687* | (2006.01) |
| *H03K 17/00* | (2006.01) |
| *H01L 29/16* | (2006.01) |
| *H01L 29/20* | (2006.01) |
| *H03K 17/0814* | (2006.01) |
| *H03K 17/785* | (2006.01) |

(52) U.S. Cl.
CPC ....... *H03K 17/00* (2013.01); *H03K 17/08142* (2013.01); *H03K 17/785* (2013.01); *Y10T 307/74* (2015.04)

(56) References Cited

U.S. PATENT DOCUMENTS

| | | | |
|---|---|---|---|
| 4,611,123 A | 9/1986 | McDonald | |
| 4,686,383 A * | 8/1987 | Croft | H03K 17/0822 326/68 |
| 4,742,380 A * | 5/1988 | Chang | H01L 27/0705 257/113 |
| 5,057,791 A | 10/1991 | Thompson et al. | |
| 5,066,869 A | 11/1991 | Neidorff | |
| 5,216,352 A | 6/1993 | Studtmann | |
| 5,463,252 A | 10/1995 | Jones et al. | |
| 5,583,384 A | 12/1996 | Henry | |
| 5,606,482 A | 2/1997 | Witmer | |
| 5,714,777 A | 2/1998 | Ismail et al. | |
| 5,726,848 A | 3/1998 | Boenig | |
| 5,742,463 A | 4/1998 | Harris | |
| 5,793,064 A * | 8/1998 | Li | H03K 17/567 257/119 |
| 5,999,417 A * | 12/1999 | Schlecht | H02J 1/102 363/131 |
| 6,178,077 B1 | 1/2001 | Kaluza et al. | |
| 6,744,883 B1 * | 6/2004 | Bingel | H04M 1/74 379/106.09 |
| 6,876,245 B2 | 4/2005 | de Buda | |
| 7,072,162 B2 | 7/2006 | D'Amato | |
| 7,199,491 B2 | 4/2007 | Novinsky et al. | |
| 7,436,642 B2 | 10/2008 | Grisoni | |
| 7,768,758 B2 | 8/2010 | Maier et al. | |
| 8,130,023 B2 | 3/2012 | Veliadis | |
| 8,300,373 B2 * | 10/2012 | Morrish | H02H 9/025 361/91.1 |
| 2002/0190722 A1 * | 12/2002 | Singh | G01N 27/92 324/459 |
| 2003/0123264 A1 * | 7/2003 | Farrington | H02M 3/33569 363/16 |
| 2005/0269633 A1 * | 12/2005 | Singh | H01L 29/7825 257/336 |
| 2006/0198173 A1 | 9/2006 | Rozman | |
| 2006/0262575 A1 * | 11/2006 | Schlecht | H02M 3/33561 363/17 |
| 2006/0285368 A1 * | 12/2006 | Schlecht | H02M 3/335 363/21.06 |
| 2008/0204958 A1 | 8/2008 | Shearon et al. | |
| 2009/0033293 A1 | 2/2009 | Xing et al. | |
| 2009/0164196 A1 * | 6/2009 | Saitou | G06F 17/5036 703/14 |
| 2009/0167411 A1 * | 7/2009 | Machida | H01L 27/0605 327/427 |
| 2009/0289691 A1 * | 11/2009 | Fuller | H03K 17/166 327/432 |
| 2010/0277006 A1 | 11/2010 | Urciuoli | |
| 2011/0267132 A1 | 11/2011 | Lubomirsky et al. | |

OTHER PUBLICATIONS

Urciuoli, D. P.; Veliadis, V.; Ha, H. C.; Lubomirsky, V. "Demonstration of a 600-V, 60-A, Bidirectional Silicon Carbide Solid-state Circuit Breaker." Proc. 2011 IEEE Applied Power Electronics Conf., Fort Worth, TX, 2011, 354-358.

Urciuoli, D. "Bidirectional Silicon Carbide Solid-state Circuit Breaker Development," ARL-TR-6120, Sep. 2012.

* cited by examiner (A)          (B)          (C)

SOLID-STATE CIRCUIT BREAKERS AND RELATED CIRCUITS

CROSS REFERENCE TO RELATED APPLICATIONS

This application is a continuation-in-part (CIP) of U.S. patent application Ser. No. 13/017,227, filed Jan. 31, 2011, which is a continuation-in-part (CIP) of U.S. patent application Ser. No. 12/768,898, filed Apr. 28, 2010, claiming the benefit of U.S. Provisional Patent Application No. 61/174,129, filed Apr. 30, 2009. Each of the aforementioned parent applications is hereby incorporated by reference in its entirety.

GOVERNMENT INTEREST

Governmental Interest—The invention(s) described herein may be manufactured, used and licensed by or for the U.S. Government without the payments of royalties thereon.

FIELD

This application relates broadly to circuit breakers, and in particular to solid-state circuit breakers and related circuits.

BACKGROUND

Alternating current (AC) systems as well as many direct current (DC) power electronic systems have bidirectional current flow through a single power distribution bus. Commonly, these systems supply energy to and from electrical storage elements. Other AC and DC systems operate between active power sources and/or potential power sources. In these cases, a fault can result in an over-current condition in either direction in the system. Some examples of these systems include hybrid electric vehicle drives, grid-tie photovoltaic inverter systems, and bidirectional DC-DC converters. Such systems cover a wide range of power levels, generally require fault protection, and benefit further from bidirectional fault protection.

For distributed and OFF-grid power systems and hybrid-electric ground vehicle power systems, power electronic converters and power distribution equipment operating at up to several hundred volts and up to hundreds of kilowatts are being developed. To prevent damage to converters or other system components during fault conditions, fault current interrupt speeds in tens to hundreds of microseconds are necessary. In many of these systems, AC and DC power components operate between two voltage busses having independent sourcing capability, and require bidirectional fault isolation. Such conditions can require fault protection systems having symmetric ratings for bidirectional voltage blocking in the OFF-state and bi-directional current conduction in the ON-state.

In many applications, bidirectional fault isolation is provided by mechanical contactors or relays. However, mechanical fault protection devices often do not have adequate actuation speeds for protection of solid-state system components. Furthermore, these mechanical devices can suffer severe degradation, dramatically reducing operating life, or resulting in catastrophic system failure.

While bidirectional solid-state fault protection devices exist, they do not provide full functionality when applied to direct current and voltage, while also providing low conduction losses and self-triggering at low conduction voltage drops. For instance, commercially available bidirectional solid-state circuit breakers are designed for AC and voltage and generally use thyristors that stop current following an AC zero crossing. Other approaches using field effect semiconductor devices can have higher conduction losses resulting from more than two power transistors connected in series (such as a cascode configuration), and higher turn-OFF thresholds at high currents.

BRIEF SUMMARY

Various solid-state circuit breakers and related circuits embodiments are presented in this application.

In one embodiment, a common node bidirectional solid-state circuit breaker (BDSSCB) which has diodes connected between terminals of its switches is presented. This BDSSCB includes: a pair of solid-state switches, each one of said pair of solid-state switches having a source, gate and drain, the pair of solid-state switches being electrically connected at a common node; and a pair of diodes, each one of the pair of diodes electrically connecting the gate and either the drain or the source of a respective one of said pair of solid-state switches which is not connected to the common node.

In another embodiment, a shunt voltage actuated driver (SVAD) circuit for use with a bidirectional solid-state circuit breaker is presented. The BDSSCB used here may have a pair of solid-state power switches, each one of said pair of solid-state power switches having a source, gate and drain, wherein the sources of the solid-state power switches are electrically connected to a common node. This SVAD includes: a voltage triggered module configured to connect to said pair of solid-state power switches and the common node comprising: a pair of solid-state switches, each of the pair having a source, gate and drain, the drains of the pair of solid-state switches being configured to electrically connect to one of the respective drains of the pair of solid-state power switches of the BDSSCB; and a plurality of shunt resistors in series electrically connecting the pair of solid-state switches, and being configured to electrically connect to the common source node, wherein the pair of solid-state switches each have a blocking voltage greater than or equal to that of the respective solid-state power switch of the BDSSCB.

In yet another embodiment, a shunt voltage actuated driver circuit for use with a unidirectional solid-state circuit breaker is presented. The UDSSCB used here may have a solid-state power switch having a source, gate and drain. This SVAD includes: a voltage triggered module configured to connect to the solid-state power switch comprising: a solid-state switch having a source, gate and drain, the drain of the solid-state switch being configured to electrically connect to the drain of the solid-state power switch of the UDSSCB; and a plurality of shunt resistors in series electrically connecting to the solid-state switch, and being configured to electrically connect to the source of the solid-state power switch, wherein the solid-state switch has a blocking voltage greater than or equal to that of the solid-state power switch of the UDSSCB.

In an additional embodiment, a bipolar current actuated driver (BCAD) for use with a bidirectional solid-state circuit breaker is presented. The BDSSCB used here may have a pair of solid-state power switches, each one of said pair of solid-state power switches having a source, gate and drain, wherein the sources of the solid-state power switches are electrically connected to a common node. This BCAD includes: a pair of solid-state switches, each of said pair of solid-state switches having a drain, gate, and source, with the drain being connected to one or more series resistors and the source being configured to connect to the common node; and one or more resistors connected to the pair of solid-state switches are configured to connect to a respective gate of one of the pair of solid-state power switches of the BDSSCB.

In a further embodiment, a multi-directional solid-state circuit breaker (MDSSCB) is presented. This MDSSCB includes: at least three solid-state switches, each of the at least three solid-state switches having a source, gate and drain, the at least three solid-state switches being electrically connected to a common node, wherein the at least three solid-state switches are configured to provide conduction and voltage blocking in at least three discrete electrical paths relative to the common node.

Other and further embodiments of the present invention(s) are described below.

Examples of electrical devices including and/or incorporating one or more of the aforementioned embodiments are also presented.

BRIEF DESCRIPTION OF THE DRAWINGS

Embodiments disclosed herein, briefly summarized above and discussed in greater detail below, can be understood by reference to the illustrative depicted in the appended drawings. It is to be noted, however, that the appended drawings illustrate only typical embodiments and are therefore not to be considered limiting of its scope, for the invention(s) may admit to other equally effective embodiments.

Figure 1:
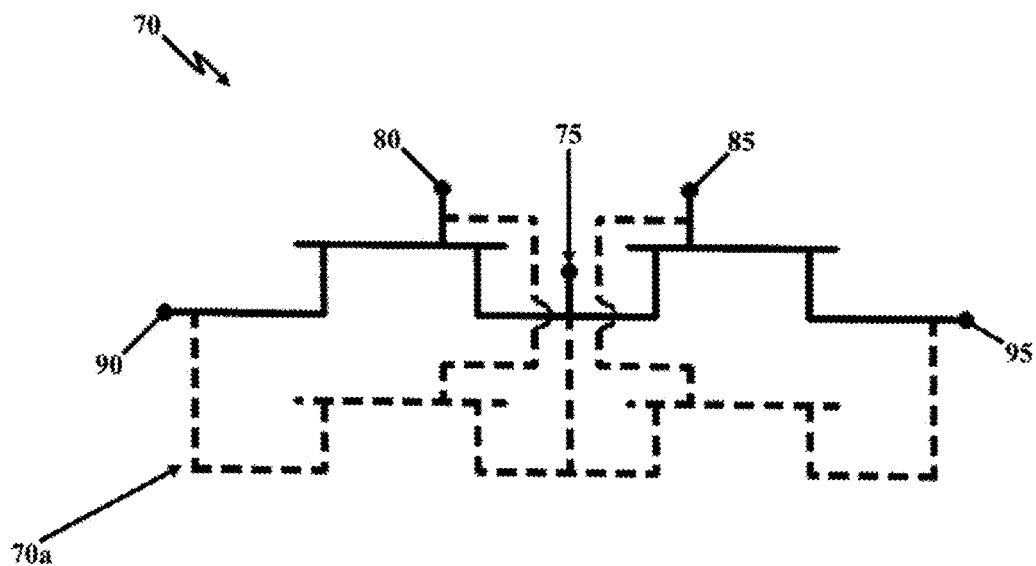
FIG. 1 illustrates a schematic of one common-source BDSSCB according to embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The embodiments and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention(s). The examples used herein are intended merely to facilitate an understanding of ways in which the embodiments may be practiced and to further enable those skilled in the art to practice the embodiments. Accordingly, the examples should not be construed as limiting the scope of the embodiments.

Because mechanical contactors (such as relays) do not provide adequate actuation speeds in many applications, and suffer severe degradation during repeated fault isolation, a solid-state circuit breaker (SSCB) may be used. SSCBs offer the advantages of solid-state switching devices such as fast transition speed and high cycle life, while providing benefits of conventional electromechanical switches such as bidirectional conduction and blocking.

Disclosed herein are various embodiments for solid-state circuit break circuits and related driving circuits which are configured to provide fault protection in a variety of systems, which include but are not limited to AC systems, DC systems, AC-to-AC power conversion and/or power distribution systems, AC-to-DC power conversion and/or power distribution systems, DC-to-AC power conversion and/or power distribution systems, and DC-to-DC power conversion and/or power distribution systems. High speed fault protection is capable of interrupting any wave shape (e.g., AC, DC or pulse) for BDSSCB fault protection discussed herein; it does not apply to the UDSSCB and may not apply to other high speed SSCBs.

Bidirectional Solid-State Circuit Breaker (BDSSCB)

According to various embodiments, a bidirectional solid-state circuit breaker (BDSSCB) provides a versatile high-speed, high-reliability alternative to electromechanical switching devices for high voltage application, such as 600-V or higher. The BDSSCB operates as a normally-ON, four-quadrant switching element, providing bidirectional current conduction and bidirectional voltage blocking for use in AC, DC, and bidirectional DC systems. In certain embodiments, a pair of common-source connected solid-state switches may form the bidirectional solid-state power switch.

The four-quadrant switching element can be achieved using two solid-state switches connected in an anti-serial configuration. This configuration may be thought of as a series connection of like devices in opposite directions or opposite orientations, such as a common-source configuration (i.e., source-source connection) or a common-drain configuration (i.e., drain-drain connection). In some embodiments, the common-source configuration may be chosen over the common-drain configuration for the simplicity of using a single gate drive for control of both power switches. Many of the embodiments described below adopt this approach. Of course, it should be appreciated that the common-drain configuration may be used in other embodiments. In this latter configuration, the power switches could require individual gate drives instead of a common one, which may result in an overall increase of complexity.

FIG. 1 illustrates a schematic of one common-source BDSSCB according to embodiments. The BDSSCB includes a common-source solid-state switch structure 70 formed of a pair of solid-state switches. The solid-state switches may be transistors, each having a source, gate and drain, which are connected in series so as to share a common source node. In certain embodiments, the switches may be silicon carbide (SiC) junction field effect transistors (JFETs) or static induction transistors (SITs) or SiC normally-on (depletion mode) metal oxide semiconductor field effect transistors (MOSFETs). These particular transistors have high voltage blocking ratings (e.g., at or above 1200 V) and low drain-to-source resistances (e.g., relative to other semiconductor switching devices at this voltage rating). They may be fabricated from wide band gap semiconductor material(s) having a collectively low conduction loss to provide large current handling capability and fast transition speed for current interruption.

In some BDSSCB embodiments, the power switches may be vertical JFETs (VJFETs) as described in and further depicted in FIG. 1 of U.S. patent application Ser. No. 12/768,898, one of the aforementioned parent applications.

For typical circuit breaker applications, the pair of solid-state switches may be configured to operate in a normally-ON mode (i.e., to be turned OFF and thus prevent current flow via their drains) rather than a normally-OFF mode (i.e., to be turned ON and thus enable current flow via their drains). This is also known as a depletion mode operation in field effect semiconductor transistors. The sources of each switch are electrically connected in series at a common-source node or terminal 75. Gate nodes or terminals 80, 85 and drain nodes terminals 90, 95 are further provided. In some implementations, one or more additional pairs of common-source solid-state switch structure 70a may be further provided in parallel connection indicated in dotted line. The additional pairs of switches, when included, provide additional current conducting capability, and/or reduction in total on-state resistance.

Figure 3:
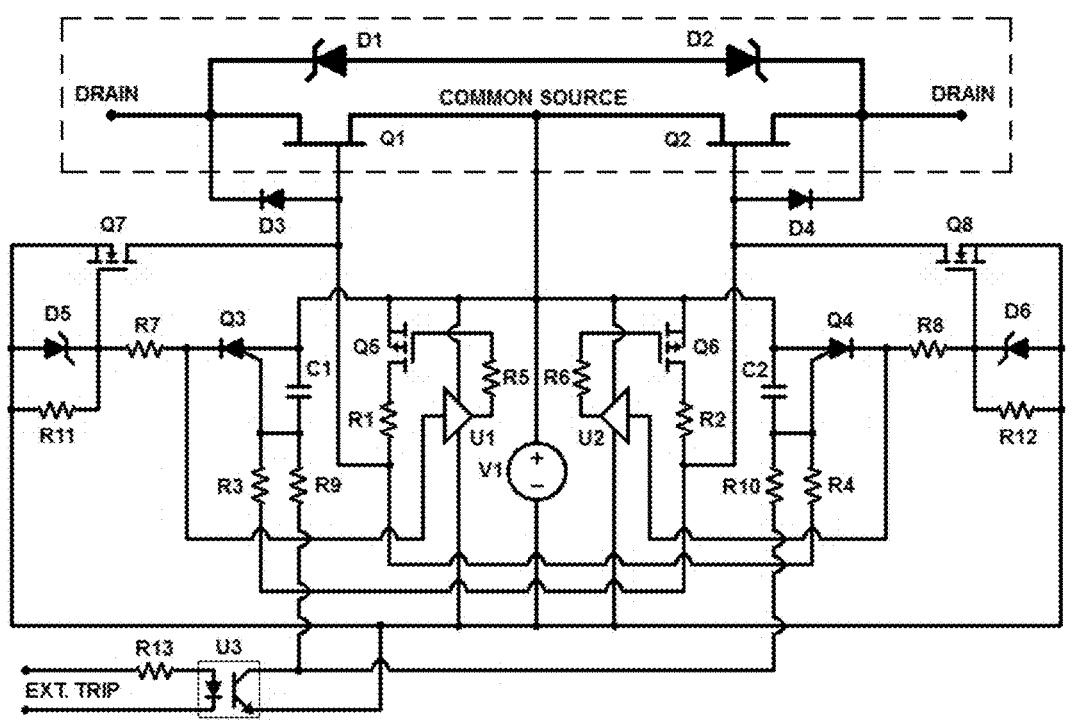
FIG. 3 illustrates a schematic of a BDSSCB and a BCAD using diodes/rectifiers according to an embodiment.

In certain embodiments, the BDSSCB may include one or more transient voltage suppression (TVS) devices connected in parallel with the opposing power switch drain connections. One exemplary TVS device is shown in FIG. 3 which includes two diodes in series with their respective cathodes connected to the drains of the solid-state switches.

By employing the depletion mode switches or normally-ON switches in the BDSSCB, the solid-state switches exhibit a lower on-state voltage drop, per unit of device active area, when compared to normally-OFF (or enhancement mode) devices, such as enhancement mode SiC MOSFET devices. Solid-state switches having low resistance reduce power dissipation and allow the reduction of either device size, or cooling requirement, or both.

In contrast to mechanical devices, BDSSCBs (even if coupled with transient voltage suppression components), can be actuated three orders of magnitude faster and may provide a significant reduction in component sizes through the integration of power electronics. These advantages, which apply to both the system and the protection device, further enable: prevention of failures, longer operating life, reduced maintenance, and reduction of component stresses. Although solid-state switches may not provide galvanic isolation, compared to electromechanical switches, solid-state switches can be more tolerant of high levels of shock and vibration, making them more suitable for more applications, such as automotive and rugged industrial and military applications.

BDSSCBs may have higher conduction voltage drops than their mechanical counterparts; however, current scalable designs can dramatically reduce on-state losses, and semiconductor packaging techniques can enable adequate cooling. BDSSCBs facilitate dramatic improvements in reliability and operating life, resulting in superior system protection and reduced system maintenance and repair.

The series common-source configuration of solid-state switches in the BDSSCB necessitates that a solid-state switch or set of parallel switches reverse conduct during BDSSCB conduction in either direction. Reverse conduction occurs when positive current is passed through the switch from source-to-drain.

Bipolar Current Actuation Using Diodes/Rectifiers in BDSSCBs

For solid-state switches, such as SiC junction JFETs or SITs having low ON-state resistance, large conduction currents can be required to induce the voltage sufficient for bipolar gate current to flow from the gate to the drain of one or more reverse conducting switches in the common-source BDSSCB configuration. In some BDSSCB implementations, such high conduction currents could exceed the desired maximum conduction current of one or more of the switches.

In order to reduce the conduction current level at which bipolar gate current actuated turn-OFF occurs, one or more diodes or rectifiers can be connected between the gate and drain of one or more switches such that the anode of the diode(s) is connected to the gate of the switches and the cathode of the diode(s) is connected to the drain of the switches.

Figure 2:
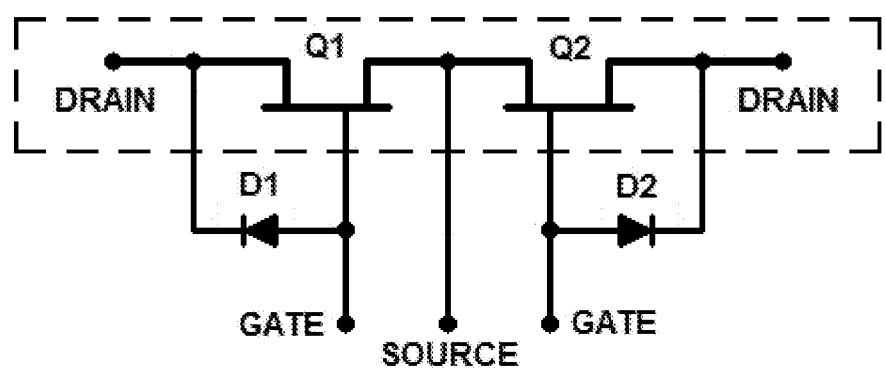
FIG. 2 illustrates a schematic of a common-source BDSSCB having diodes connected between gate and drain terminals of the switches according to an embodiment.

FIG. 2 illustrates a schematic of a common-source BDSSCB having diodes connected between gate and drain terminals of the switches according to an embodiment.

The BDSSCB includes a common-source solid-state switch structure formed of a pair of solid-state switches. The solid-state switches may be transistors, each having a source, gate and drain, which are connected in series so as to share a common source node. For typical circuit breaker applications, the switches may be configured to operate in a normally-ON mode rather than a normally-OFF mode. The sources of each switch are electrically connected in series at a common source node or terminal. Gates nodes or terminals and drain nodes terminals are further provided. In some implementations, one or more additional pairs of common-source solid-state switch structure may be further provided in parallel connection (similar to the dotted line depicted in FIG. 1).

The sources of the switches are electrically connected to a common node, and the gate and drain of each switch are electrically connected by at least one diode having an anode and cathode. The diodes D1, D2 may be Zener, Schottky, etc., or may be another type of rectifier device, for instance.

As shown, diodes D1, D2 are positioned at gate-drain junctions of each of the switches in the BDSSCB. At each gate-drain junctions, the anode of the diode is connected to the gate of the switch, and the cathode of the diode is connected to the drain of that switch.

In other implementations, one or more additional diodes may be connected in parallel to the gate-drain junction of each of the switches in the BDSSCB. This parallel arrangement of diodes could enable BDSSCB triggering at various BDSSCB currents and temperatures. BDSSCB blocking voltage ratings can be maintained when diodes are used that have blocking voltages greater than or equal to the drain blocking voltages of the JFETs to which they are connected. Diodes that have a lower forward voltage drop during conduction than that of the gate-to-drain junction of the switch(s), enable the bipolar current actuated BDSSCB gate driver to trigger the switches to turn-OFF at lower drain-to-source and source-to-drain currents.

Because the diodes only conduct small currents to trigger the BDSSCB bipolar current actuated gate driver, they can be small, low power, devices and can be integrated into the gate drive circuit. For instance, the diodes may be rated for greater than 1200-V blocking and less than 1-A RMS current.

Bipolar Current Actuated Driver (BCAD) for BDSSCB

BDSSCB applications have various electrical and thermal operating conditions. At higher device temperatures, for instance, JFET ON-state resistance increases causing a higher conduction voltage drop and higher device power dissipation. Under such operating conditions, JFET current ratings are reduced and bipolar gate current forms at lower reverse conduction currents. Also, any currents including short duration pulses in excess of the rated JFET reverse current can cause undesired bipolar gate current.

Because the source-drain voltage values that cause bipolar gate current can be slightly greater than or equal to the maximum source-drain voltage values of device power dissipation limits, the presence of bipolar gate current can be used to determine if the BDSSCB should be transitioned to the OFF-state.

A BCAD circuit thus is configured to sense bipolar gate current in reverse conducting solid-state power switches (e.g. JFETs) and to provide proper gate control to transition the solid-state power switches to the OFF-state. The driver circuit maintains (latches) the solid-state power switches in the OFF-state after bipolar gate current is detected to avoid a possible oscillatory condition and/or a possible drain current regulation condition caused by operation in the linear region rather than operation in the saturation or cutoff regions. The driver also provides two isolated input control lines for external independent or synchronized power switch gate control. These control lines can be used for manual control or for actuation from the output of other sensors or devices.

FIG. 3 illustrates a schematic of a BDSSCB and a bipolar current actuated driver (BCAD) circuit using diodes/rectifiers according to an embodiment. The BDSSCB is actuated using the BCAD.

Components of the BDSSCB power stage are shown within the dashed rectangle. The BDSSCB may be configured for a power stage for a high powered system, for instance, operating at about 600 V or higher. The BDSSCB power stage includes a pair of common-source connected switches Q1, Q2 configured to operate in a normally-ON (i.e., to be turned OFF).

Switches Q1, Q2 may be JFETs or MOSFETs, for instance. JFETs and MOSFETs can be driven efficiently, and have a positive temperature coefficient of ON-state resistance that promotes current sharing among parallel connected devices. Although JFETs and MOSFETs are only designed to block high-voltage from drain-to-source, they are capable of both drain-to-source and source-to-drain conduction with nearly symmetric voltage drops.

In certain embodiments, SiC depletion mode JFETs or SiC depletion mode MOSFETs having very low specific ON-state resistances, resulting in low conduction losses, relatively small device areas, and reduced thermal management may be utilized. One such transistor is the SemiSouth SJDP120R085 SiC depletion mode JFET. At a zero-volt gate-to-source bias, SiC depletion mode JFETs can conduct a high percentage of their drain current rating corresponding to a positive gate bias. For the same drain-to-source voltage drop, at a zero-volt gate-to-source bias, the SemiSouth SJDP120R085 SiC depletion mode JFET, for example, conducts a drain current of approximately 87% of its rating for a 2-V gate-to-source bias. In a case where JFET gate control is lost while limiting gate-to-source bias to 2 V to maintain unipolar JFET operation over a wide temperature range, only about 13% of the JFET operating current would be lost. However, because this condition keeps JFET drain-to-source voltage constant, the JFET would also have 13% less conduction loss. Additionally, positive gate-to-source bias can cause undesirable bipolar gate current flow in reverse conducting SiC JFETs in the common-source configuration. MOSFETs are not susceptible to bipolar gate current flow. Positive gate-to-source bias added to the source-to-drain reverse conduction drop can lead to bipolar gate current flow through the intrinsic JFET gate-to-drain diode, as discussed in Urciuoli, D. P.; Veliadis, V.; Ha, H. C.; Lubomirsky, V. Demonstration of a 600-V, 60-A, Bidirectional Silicon Carbide Solid-state Circuit Breaker. *Proc. 2011 IEEE Applied Power Electronics Conf.*, Fort Worth, Tex., 2011, 354-358, herein incorporated by reference in its entirety. Bipolar gate current in reverse conducting JFETs can be avoided over a large operating range using low voltage or zero-volt gate-to-source biases.

In some implementations, one or more additional pairs of common-source solid-state switches may be further provided in a parallel connection with the power switches in the BDSSCB (as similarly depicted in FIG. 1).

In certain embodiments, the BDSSCB may include one or more transient voltage suppression devices connected in parallel with the opposing power switch drain connections. The TVS device is configured to react to sudden or momentary overvoltage conditions (e.g., avalanche breakdown at turn-OFF) to protect the power switches Q1, Q2 and/or other electronics. During BDSSCB conduction, series line inductance stores energy proportional to the square of the conducted current. If the inductance and/or current are high enough, the turn-OFF transition can impose a high transient voltage across the BDSSCB power stage in excess of its rated blocking voltage. Thus, a bidirectional array of breakover diodes having a breakover voltage rating less than the breakdown voltage rating of the switches clamps (i.e., limits) the transient voltage, thereby protecting the switches during the BDSSCB turn-off transition. Breakover diodes generally have a positive temperature coefficient of breakover voltage which promotes current sharing between parallel connected devices. One exemplary TVS device is shown in FIG. 3 which includes two diodes D1, D2 in series, with their cathodes connected to the respective drains of the power switches Q1, Q2.

The BCAD includes the components shown outside the dashed rectangle. The BCAD is fabricated using discrete circuit components mounted on a printed circuit board. The BDSSCB power stage is mounted to the BCAD circuit board and is electrically connected to it. Power is supplied to the BCAD by the DC supply voltage V1. In some instances, V1 may be 15VDC.

The BCAD generally includes two symmetrical circuit portions, each having a diode (e.g., D3, D4) connected to the drain and gate of one of the BDSSCB power switches and associated electronics.

In the BCAD, a pair of diodes D3, D4 is connected to the drains of the common-source connected switches Q1, Q2 of the BDSSCB. The diodes D3, D4 may be Zener, Schottky, etc., or may be another type of rectifier device, for instance. Each of the diodes Q3, Q4 have an anode and cathode, with the cathodes of the diodes D3, D4 being electrically connected to one of the respective drains of the pair of solid-state switches Q1, Q2 of the BDSSCB. The anodes of the diodes D3, D4 are electrically connected to one of the respective gates of the pair of solid-state switches Q1, Q2 of the BDSSCB.

Switch Q5 is in series with resistor R1, and switch Q6 is in series with resistor R2. Switches Q5 and Q6 may be MOSFETs, for instance, each having a gate, drain, and source. Switches Q5 and Q6 are low-current (e.g. 1 A), low-voltage (e.g. 25 to 40 V) rated normally-OFF switches held in the ON-state by drivers U1, U2 during BDSSCB conduction. Switches Q5, Q6 could also be normally-ON switches. The sources of Q5 and Q6 are connected together and to the common-source connection of the BDSSCB power switches. Resistors R1, R2 are connected to the drains of switches Q5 and Q6, respectively. Resistors R1, R2 are also connected to the gates of switches Q1, Q2 of the BDSSCB, respectively. Resistors R1, R2 have resistance values of approximately 50 ohms, for example. Although, it may be appreciated that number of resistors may vary from that shown so long as R1 and R2 are present.

Higher conduction voltage drops form across the BDSSCB power switches Q1, Q2 as higher currents flow through them. When sufficient current is conducted across the drains of the BDSSCB Q1, Q2, the voltage drop between the gate and drain of switch Q1 or switch Q2 will cause diode D3 or D4 to conduct a small portion of the BDSSCB current. The current conducted by diode D3 will flow from the Q1, Q2 common-source connection through switch Q5, and resistor R1 for BDSSCB current flow from switch Q2 to switch Q1. The current conducted by diode D4 will flow from the Q1, Q2 common-source connection through switch Q6, and resistor R2 for BDSSCB current flow from switch Q1 to switch Q2.

For low diodes D3, D4 currents (e.g., 5 to 10 mA), switches Q3, Q4 can be triggered to turn-ON by the voltage drops across resistors R1, R2. For example, switches Q3, Q4 can be unijunction transistors having an anode, gate, and cathode. Capacitors C1, C2 are connected between the anode and gate of the switches Q3, Q4 to prevent undesired triggering of the switches from circuit transients, and resistors R3, R9 and R4, R10 are connected with the switches' gate to limit gate current.

Switches Q3 and Q4 latch in the ON-state while anode-to-cathode current is supplied by the DC supply voltage V1. The anodes of switches Q3, Q4 are connected to the BDSSCB common-source, and the gates of switches Q3, Q4 are connected through resistors R3, R4 to the gates of BDSSCB power switches Q2, Q1 respectively. Switches Q3, Q4 may be normally-OFF, and can turn-ON at anode-to-drain voltages as low as 0.4 V, for instance. Resistor R7 is connected between the cathode of switch Q3 and the gate of switch Q7. Resistor R8 is connected between the cathode of switch Q4 and the gate of switch Q8. Resistors R7 and R8 may be several hundred ohms to limit the current conducted by switches Q3 and Q4 respectively.

Diodes D5, D6 connected in series with the switches Q3, Q4 provide a fixed gate voltage for the switch Q7 or Q8. Switches Q7 and Q8 may be normally-OFF MOSFETs having a low current (e.g. 1 to 5 A) and low-voltage (e.g. 25 to 40 V) rating and having a drain and source. Switches Q7 and Q8 have their drains connected to the gates of Q1 and Q2, respectively, while the sources of Q7 and Q8 are both connected to the negative terminal of the supply V1. When either switch Q3 or Q4 turns-ON it conducts current from supply V1 (e.g. 15 V) from anode to cathode, through resistor R7 or R8 to turn-ON switch Q7 or Q8, respectively. Once either switch Q7 or Q8 turns-ON, it will connect either resistor R1 or R2 to the negative terminal of the supply, thereby triggering the opposing switch Q4 or Q3, respectively, to turn-ON, thereby turning-ON the other switch Q7 or Q8.

The time interval between forward and reverse conducting set of devices controlling the gate potential of the reverse conducting solid-state device transitions to the OFF-state may be determined in part by the values of the capacitors C1, C2 connected across the anode and gate of the switches Q3, Q4 and by the resistors R3, R4 and R9 R10 connected in series with the switches gates. By gating the forward conducting solid-state switch to the OFF-state before gating the reverse conducting solid-state switch to the OFF-state, the reverse conducting solid-state switch is protected from a source-to-drain voltage in excess of its reverse blocking capability.

The inputs of drives U1 and U2 are connected to the cathodes of switches Q3 and Q4, respectively. Drives U1 and U2 may be, non-inverting MOSFET/IGBT low-side gate drivers, for instance. When switches Q3, Q4 are turned-ON, the inputs of drives U1, U2 receive high level logic signals thereby turning-OFF switches Q5, Q6 respectively.

Optocoupler U3 can be used to externally trigger the BDSSCB to the OFF-state. The collector of U3 is connected to both resistors R9 and R10, while the emitter of U3 is connected to the negative terminal of the supply V1. Resistor R9 is connected to the gate of switch Q3. Resistor R10 is connected to the gate of switch Q4. When U3 is turned ON by its light emitting diode (LED), the gates of Q3 and Q4 are pulled to a low potential, thereby simultaneously turning-ON Q3 and Q4 which turn-OFF the BDSSCB.

The specific component symbols used in FIG. 3 are intended to show functionality of one BDSSCB BCAD embodiment. The solid-state switches and optocouplers can be implemented using a range of transistors types. The resistors can have fixed or variable resistances.

Figure 5:
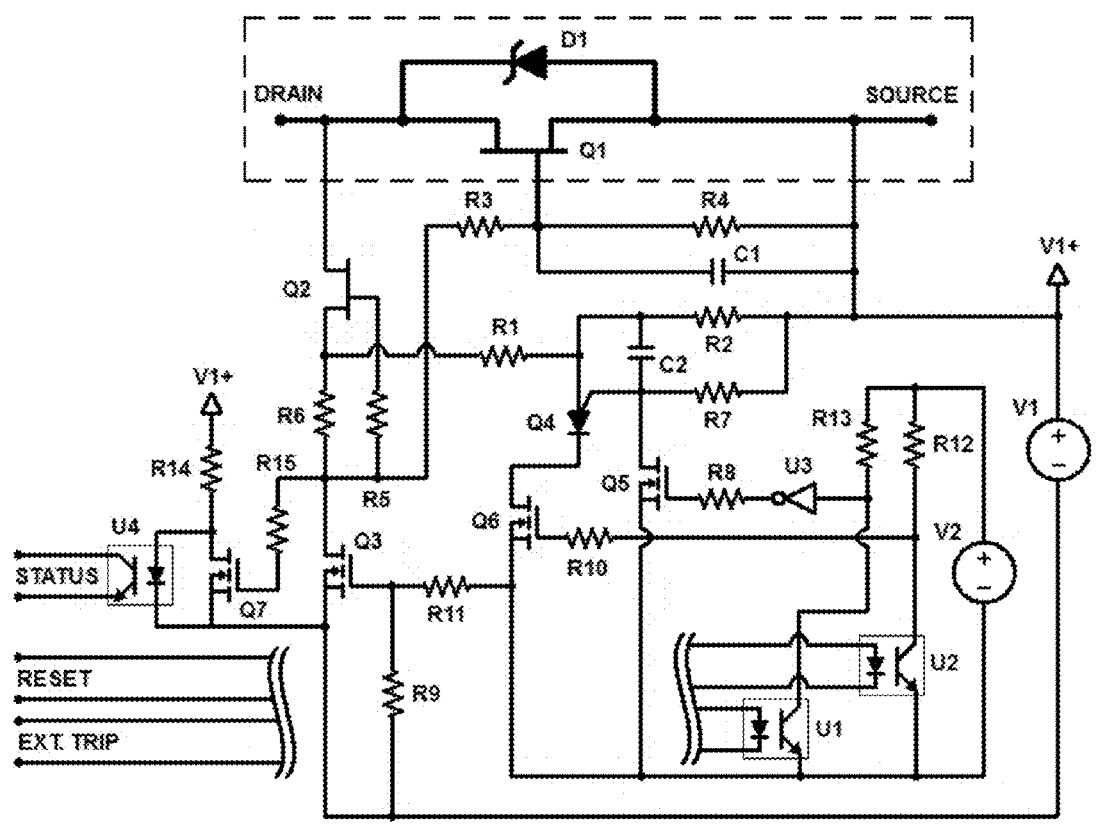
FIG. 5 illustrates a schematic of a UDSSCB and a SVAD according to an embodiment.

In other embodiments, the BDSSCB may be operably coupled to the BCAD circuit as described in and further depicted in FIG. 5 of U.S. patent application Ser. No. 13/017,227, one of the aforementioned parent applications, in an analogous manner as described above. This particular BCAD circuit utilizes a pair of resettable fuses operatively connected to respective gates of two FETs in the circuit breaker. When there is a sufficient voltage differential across one of the resettable fuses, that fuse is activated causing its corresponding FET gate to become negative and turn-OFF that FET. The BCAD embodiment described herein may use more common components, although it generally has lower power consumption than that disclosed in the aforementioned parent application.

Shunt Voltage Actuated Driver (SVAD) for Use with a BDSSCB

To further reduce the conduction voltage drop at which the BDSSCB is triggered to turn OFF, to levels below the voltage drops at which bipolar current forms in either the gate-to-drain junction of the reverse conducting BDSSCB JFETs or in a diode/rectifier connected across the gate-to-drain junction(s) of the reverse conducting JFETs, a BDSSCB turn-OFF triggering operation is introduced which is actuated by a voltage drop across one or more resistors of a shunt voltage actuated driver.

This operation reduces the number of bipolar device junction voltage drops for BDSSCB gate driver actuation, thereby enabling a lower BDSSCB conduction voltage to trigger BDSSCB turn-OFF. Furthermore, this operation does not rely on the threshold voltage level of a field effect transistor to initiate actuation of the gate driver. By contrast, this is how certain conventional devices work. By not relying on one or more transistor gate threshold voltage levels, here it also enables a lower BDSSCB conduction voltage to trigger BDSSCB turn-OFF.

Figure 4:
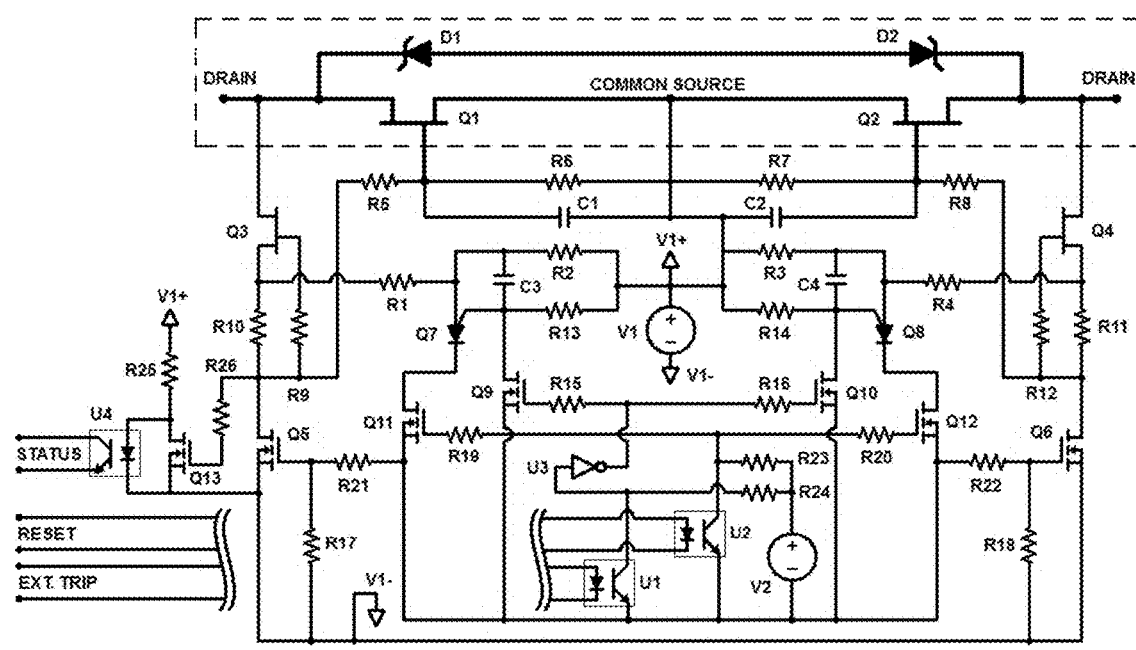
FIG. 4 illustrates a schematic of a BDSSCB and a SVAD according to an embodiment.

FIG. 4 illustrates a schematic of a BDSSCB and a SVAD according to an embodiment.

Components of the BDSSCB power stage are shown within the dashed rectangle. The BDSSCB may be configured for a power stage for a high powered system, for instance, operating at about 600 V or higher. The BDSSCB power stage includes a pair of common-source connected switches Q1, Q2 configured to operate in a normally-ON (i.e., to be turned OFF).

Switches Q1, Q2 may be JFETs or MOSFETs, for instance. JFETs and MOSFETs can be driven efficiently, and have a positive temperature coefficient of ON-state resistance that promotes current sharing among parallel connected devices. Although JFETs and MOSFETs are only designed to block high-voltage from drain-to-source, they are capable of both drain-to-source and source-to-drain conduction with nearly symmetric voltage drops.

In certain embodiments, SiC depletion mode JFETs or SiC depletion mode MOSFETs having very low specific ON-state resistances, resulting in low conduction losses, relatively small device areas, and reduced thermal management may be utilized. One such transistor is the SemiSouth SJDP120R085 SiC depletion mode JFET. At a zero-volt gate-to-source bias, SiC depletion mode JFETs can conduct a high percentage of their drain current rating corresponding to a positive gate bias. For the same drain-to-source voltage drop, at a zero-volt gate-to-source bias, the SemiSouth SJDP120R085 SiC depletion mode JFET, for example, conducts a drain current of approximately 87% of its rating for a 2-V gate-to-source bias. In a case where JFET gate control is lost while limiting gate-to-source bias to 2 V to maintain unipolar JFET operation over a wide temperature range, only about 13% of the JFET operating current would be lost. However, because this condition keeps JFET drain-to-source voltage constant, the JFET would also have 13% less conduction loss. Additionally, positive gate-to-source bias can cause undesirable bipolar gate current flow in reverse conducting SiC JFETs in the common-source configuration. Positive gate-to-source bias added to the source-to-drain reverse conduction drop can lead to bipolar gate current flow through the intrinsic JFET gate-to-drain diode, as discussed in the Urciuoli article mentioned above. Bipolar gate current in reverse conducting JFETs can be avoided using low voltage or zero-volt gate-to-source biases.

In some implementations, one or more additional pairs of common-source solid-state switches may be further provided in a parallel connection with the power switches in the BDSSCB (as similarly shown in FIG. 1).

In certain embodiments, the BDSSCB may include one or more transient voltage suppression devices connected in parallel with the opposing power switch drain connections. The TVS device is configured to react to sudden or momentary overvoltage conditions (e.g., avalanche breakdown at turn-OFF) to protect the power switches Q1, Q2 and/or other electronics. During BDSSCB conduction, series line inductance stores energy proportional to the square of the conducted current. If the inductance and/or current are high enough, the turn-OFF transition can impose a high transient voltage across the BDSSCB power stage in excess of its rated blocking voltage. Thus, a bidirectional array of breakover diodes having a breakover voltage rating less than the breakdown voltage rating of the switches clamps (i.e., limits the transient voltage, thereby protecting the switches during the BDSSCB turn-OFF transition. Breakover diodes generally have a positive temperature coefficient of breakover voltage which promotes current sharing between parallel connected devices. One exemplary TVS device is shown in FIG. 4 which includes two diodes D1, D2 in series, with their cathodes connected to the respective drains of the power switches Q1, Q2.

The SVAD includes the components shown outside the dashed rectangle. The SVAD may be fabricated, for instance, using discrete circuit components mounted on a printed circuit board. The BDSSCB power stage is mounted to the SVAD circuit board and is electrically connected to it. In some embodiments, the SVAD and BDSSCB may be fabricated as one unified circuit or device.

The SVAD generally includes a BDSSCB voltage triggered module that enables a lower BDSSCB conduction voltage to trigger BDSSCB turn-OFF compared to the BCAD circuits referenced above. Here, the voltage triggered module generally includes two symmetrical circuit portions, each having an auxiliary switch (e.g., Q3 or Q4) and two or more resistors (e.g., R1, R2 and R3, R4), connecting to the drain of one of the BDSSCB power switches Q1, Q2 and the common-source of the BDSSCB switches and associated electronics.

In the SVAD, a pair of auxiliary solid-state switches Q3, Q4 is connected to the drains of the common-source connected switches Q1, Q2 of the BDSSCB. Each of the pair of auxiliary solid-state switches Q3, Q4 has a source, gate and drain, with the drains of the pair of auxiliary solid-state switches Q3, Q4 being electrically connected to one of the respective drains of the pair of solid-state switches Q1, Q2 of the BDSSCB. In some instances, these auxiliary switches Q3, Q4 may be JFETs or MOSFETs configured to operate in a depletion mode (i.e., normally-ON).

The two or more resistors (e.g., R1, R2, R3, R4) are connected between the source terminals of the auxiliary switches Q3, Q4 and the common-source of the BDSSCB switches. As shown, four series connected resistors R1, R2, R3, R4 are provided between the source terminals of the auxiliary switches Q3, Q4 and the common-source of the BDSSCB switches, with the midpoint of the four resistors R1, R2, R3, R4 being connected to the common-source of the BDSSCB switches. Although, it should be appreciated that number of resistors may vary from that shown so long as R2 and R3 are present, R1 and R4 can have zero resistance or equivalently be shorted.

To maintain the blocking voltage ratings of the BDSSCB, the auxiliary switches Q3, Q4 should have drain-to-source blocking voltages greater than or equal to those of the respective BDSSCB power switches Q1, Q2 with which they share a common-drain connection. The auxiliary switches Q3, Q4, though, can have a significantly lower current rating and therefore a significantly smaller size than the BDSSCB power switches Q1, Q2. This advantageously may allow the auxiliary switches Q3, Q4 to be integrated into the shunt voltage actuated driver (SVAD) in close proximity to other circuit components to reduce stray inductances formed by connecting Q3, Q4, R1, R2, R3, R4.

Higher conduction voltage drops form across the BDSSCB power switches Q1, Q2 as higher currents flow through them. During current conduction across drains of the BDSSCB Q1, Q2, the auxiliary switches Q3, Q4 operate in the ON-state and will conduct current through the series resistors R1, R2, R3, R4 connected between their source terminals. The level of current conducted by the auxiliary switches Q3, Q4 is low (e.g., 5 to 10 mA), and can be controlled by judiciously selecting the values of the series resistors between their source terminals. For example, the series resistors R1, R4 may be 0 to 100Ω individually, and resistors R2, R3 may be 50 to 100Ω individually.

Because at low currents the drain-to-source resistances of the auxiliary switches Q3, Q4 are much lower than those of the series resistors R1, R2, R3, R4 connected between their sources, the majority of the conduction voltage drops across the BDSSCB power switches Q1, Q2 is dropped across the series resistors R1, R2, R3, R4.

The SVAD circuit may include a voltage sensing and actuation module. As shown, the SVAD may have two shunt resistors R2, R3 that can generate variable or adjustable resistances, to enable BDSSCB turn-OFF triggering for current flow in either direction through the BDSSCB. One or more series resistors R1, R4 may also be provided in series with the shunt resistors R2, R3 can have variable or adjustable resistances enable fine-tuning of the SVAD to trigger BDSSCB turn-OFF at different conduction currents. Each of the shunt resistors is electrically connected to the common-source of the BDSSCB and to the anode of one of two switches Q7, Q8. Switches Q7, Q8 may be unijuction transistors (UJTs), for instance. With positive current flow into the drain of auxiliary switch Q3, the potential of the shunt resistor R2 is higher at the terminal connected to the switch Q7 than the terminal connected to the common-source of the BDSSCB. Likewise, with positive current flow into the drain of auxiliary switch Q4, the potential of the shunt resistor R3 is higher at the terminal connected to the switch Q8 than the terminal connected to the common-source of the BDSSCB. When sufficient voltage is present across one or both of the shunt resistors R2, R3, the respective UJT switch Q7 or Q8 is gated to the ON-state.

Once one of the UJT switches Q7, Q8 is gated to the ON-state, it will latch (hold) this state while positive current flows from its anode to cathode. Current flow through the UJT switches Q7, Q8 is sourced by the low power DC supply V1 having its positive terminal electrically connected to the BDSSCB common-source connection. That same DC supply provides charge to turn-ON transistors Q5, Q6. These transistors Q5, Q6 have their sources referenced to the negative terminal of that DC supply, and are configured to turn-OFF the auxiliary switches and BDSSCB switches, thereby blocking BDSSCB current flow in both directions. In certain implementations, these transistors may be MOSFETs, for instance.

Capacitors C1, C2 can be placed across the gate-to-source terminals of the BDSSCB power switches Q1, Q2 to enable the auxiliary switches Q3, Q4 to turn-OFF before the power switches Q1, Q2, for instance by, about 10 to 100 ns, so as to ensure that the high current path through the BDSSCB power switches Q1, Q2 is present after the low current path through the auxiliary switches and resistors R1, R2, R3, R4 has been turned OFF to prevent a current through the auxiliary switches in excess of their current rating. The power switch gate resistors R5, R8 can also have values designed to control the timing of the auxiliary switch transitions in relation to the power switch transitions.

The SVAD has a voltage isolated external triggering module configured to turn-OFF the BDSSCB including turning-ON one or more transistors Q9, Q10 configured to turn ON one or both of the UJT switches Q7, Q8. An optocoupler U1 with its collector connected to the input of the inverter block U3 is used to turn-ON both UJT switches through two switches Q9, Q10 having their drains connected to the gates of the UJT switches Q7, Q8. These switches may be MOSFETs, for instance.

The SVAD further has a voltage isolated reset module including one or more transistors Q11, Q12 configured to turn-OFF the UJT switches Q7, Q8. An optocoupler U2 with its collector connected through resistors R19, R20 to the gates of two transistors Q11, Q12 (e.g., MOSFETs) is used to stop the flow of current through both UJT switches Q7, Q8. Current flows through the optocouplers U1, U2 are sourced by another low power DC supply V2 through resistors R24, 23 respectively. For some applications, V1 may be 15 VDC, and V2 may be 5 VDC.

The SVAD has an isolated fault status module including one or more transistors Q13 configured to provide an open collector feedback signal to indicate the state of the BDSSCB. An optocoupler U4 having a light emitting diode connected in parallel with the drain and source terminals of a switch Q13 (e.g., MOSFET) is used to provide a first (pulldown) signal when the BDSSCB is in the blocking state (i.e., turned-OFF) and a second (high impedance) signal when the BDSSCB is in the conducting state (i.e., turned-ON). The LED may indicate the first signal being turned-ON, and the second signal being turned-OFF, for instance.

The specific component symbols used in FIG. 4 are intended to show functionality of one BDSSCB SVAD embodiment. The solid-state switches and optocouplers can be implemented using a range of transistors types. The resistors can have fixed or variable resistances.

Shunt Voltage Actuated Driver for Use with a Unidirectional Solid-State Circuit Breaker (UDSSCB) or SSCB A unidirectional solid-state circuit breaker is configured to block voltage at only one terminal according to embodiments. Some unidirectional circuit breakers exist for DC power systems, but not for AC power systems (although they might not be commercially referred to as unidirectional solid-state circuit breakers, because most DC systems do not have reversing or bidirectional DC voltages and currents). Although these power stages may operate similarly, the UDSSCB described herein is designed to self-trip, unlike the existing devices, which are merely electronically actuated switches. This feature is equivalent to the external trip feature of the BDSSCB and UDSSCB devices also described herein. For most DC systems, where voltages and currents do not reverse polarity and direction, respectively, a UDSSCB may be preferable to a BDSSCB.

FIG. 5 illustrates a schematic of a UDSSCB and a SVAD according to an embodiment.

Components of the UDSSCB power stage are shown within the dashed rectangle. The UDSSCB may be configured for a high powered system, for instance, operating at about 600 V or higher. The UDSSCB power stage includes a solid-state power switch Q1 configured to operate in a normally-ON (i.e., to be turned OFF). The power switch Q1 may be a transistor, such as a JFET or MOSFET, for instance, having a source, gate and drain. The power switch Q1 may be similar to the pair of solid-state power switches of the BDSSCB shown in FIG. 2. In some implementations, one or more additional solid-state switches may be further provided in a parallel connection with the power switch in the UDSSCB.

The UBSSCB may further include one or more transient voltage suppression diodes connected in parallel between the source and drain of the switch. The anode of the one or more diodes connects to the source, and their cathode connects to the drain. As shown, the UDSSCB includes a single diode D1 with its cathode connected to the drain of the power switch Q1.

The SVAD includes the components shown outside the dashed rectangle. The SVAD may be fabricated, for instance, using discrete circuit components mounted on a printed circuit board. The UDSSCB power stage is mounted to the SVAD circuit board and is electrically connected to it.

In some embodiments, the SVAD and UDSSCB (or SSCB) may be fabricated as one unified circuit or device.

The UDSSCB SVAD includes various elements and functions similar to that of the BDSSCB. For instance, as shown in FIG. 4, the BDSSCB SVAD generally includes two symmetrical circuit portions each having an auxiliary switch and series resistors connected to the drain of one of the BDSSCB power switches and the common-source of the BDSSCB switches and associated electronics. On the other hand, as shown in FIG. 5, the UDSSCB SVAD generally includes one circuit portion having an auxiliary switch and series resistors connected to the drain and the source of the UDSSCB power switch and associated electronics. The UDSSCB SVAD retains the external triggering, reset, and fault status output from the BDSSCB SVAD. Although, the UDSSCB SVAD self triggers at one half of the shunt voltage of the BDSSCB SVAD.

The SVAD generally includes a circuit portion, having an auxiliary switch (e.g., Q2) and two or more resistors (e.g., R1 and R2), connecting to the drain of the UDSSCB power switch Q1 and the source of the UDSSCB switch Q1 and associated electronics.

In the SVAD, the auxiliary solid-state switch Q2 is connected to the drain of the switch Q1 of the UDSSCB. The auxiliary solid-state switch Q2 has a source, gate and drain, with the drains of the auxiliary solid-state switch Q2 being electrically connected to the respective drain of the solid-state switch Q1 of the UDSSCB. In some instances, the auxiliary switch Q2 may be a JFET or MOSFET configured to operate in a depletion mode (i.e., normally-ON).

The two or more resistors (e.g., R1, R2) are connected between the source terminal of the auxiliary switches Q2 and the source of the UDSSCB switch Q1. As shown, two series connected resistors R1, R2 are provided. Although, it may be appreciated that number of resistors may vary from that shown so long as R2 is present. R1 can have zero resistance or equivalently be shorted.

To maintain the blocking voltage ratings of the UDSSCB, the auxiliary switch Q2, should have drain-to-source blocking voltage greater than or equal to that of the UDSSCB power switch Q1. The auxiliary switch Q2, though, can have a significantly lower current rating and therefore a significantly smaller size than the UDSSCB power switch Q1. This advantageously may allow the auxiliary switch Q2 to be integrated into the shunt voltage actuated driver in close proximity to other circuit components to reduce stray inductances formed by connecting Q2, R1, and R2.

Higher conduction voltage drops form across the UDSSCB power switch Q1 as higher currents flow through it. During current conduction across the UDSSCB, the auxiliary switch Q2 operates in the ON-state and will conduct current through the series resistors R1, R2 connected between the Q2 and Q1 source terminals. The level of current conducted by the auxiliary switch Q2 is low (e.g., 5 to 10 mA), and can be controlled by judiciously selecting the values of the series resistors. For example, the resistor R1 may be 0 to 100Ω, and resistor R2 may be 50 to 100Ω.

Because at low currents the drain-to-source resistance of the auxiliary switch Q2 is much lower than those of the series resistors R1, R2 the majority of the conduction voltage drop across the UDSSCB power switch Q1 is dropped across the series resistors R1, R2.

The SVAD circuit may include a voltage sensing and actuation module. As shown, the SVAD may have a shunt resistor R2 that can generate a variable or adjustable resistance, to enable UDSSCB turn-OFF triggering for current flow through the UDSSCB. One or more series resistors R1 may also be provided in series with the shunt resistor R2 can have variable or adjustable resistances enable fine-tuning of the SVAD to trigger UDSSCB turn-OFF at different conduction currents. The shunt resistor R2 is electrically connected to the source of the UDSSCB and to the anode of a switch Q4. The switch Q4 may be a UJT, for instance. With positive current flow into the drain of the auxiliary switch Q2, the potential of the shunt resistor R2 is higher at the terminal connected to the switch Q4 than the terminal connected to the source of the UDSSCB. When sufficient voltage is present across the shunt resistor R2, the UJT switch Q4 is gated to the ON-state.

Once the UJT switch Q4 is gated to the ON-state, it will latch (hold) this state while positive current flows from its anode to cathode. Current flow through the UJT switch Q4 is sourced by the low power DC supply V1 having its positive terminal electrically connected to the UDSSCB source. That same DC supply provides charge to the turn-ON transistor Q3. This transistor Q3 has its source referenced to the negative terminal of that DC supply, and is configured to turn-OFF the auxiliary switch and the UDSSCB switch, thereby blocking UDSSCB current flow. In certain implementations, the transistors Q3 may be a MOSFET, for instance.

A capacitor C1 can be placed across the gate-to-source terminals of the UDSSCB power switch Q1 to enable the auxiliary switch Q2 to turn-OFF before the power switch Q1 for instance by, about 10 to 100 ns, so as to ensure that the high current path through the UDSSCB power switch Q1 is present after the low current path through the auxiliary switches and resistors R1, R2 has been turned off to prevent a current through the auxiliary switch in excess of their current rating. The power switch gate resistors R3, R4 can also have values designed to control the timing of the auxiliary switch transitions in relation to the power switch transitions.

The SVAD has a voltage isolated external triggering module configured to turn-OFF the UDSSCB including a transistor Q5 configured to turn-ON the UJT switch Q4. An optocoupler U1 with its collector connected to the input of the inverter block U3 is used to turn-ON both the UJT switch Q4 through the switch Q5 having its drain connected to the gate of the UJT switch Q4. This switch Q5 may be a MOSFET, for instance.

The SVAD further has a voltage isolated reset module including a transistor Q6 configured to turn-OFF the UJT switch Q4. An optocoupler U2 with its collector connected through a resistor R10 to the gate of the transistor Q6 (e.g., MOSFETs) is used to stop the flow of current through the UJT switch Q4. Current flows through the optocouplers U1, U2 are sourced by another low power DC supply V2 through resistors R12, R13 respectively. For some applications, V1 may be 15 VDC, and V2 may be 5 VDC.

The SVAD has an isolated fault status module including a transistor Q7 configured to provide a digital feedback signal to indicate the state of the UDSSCB. An optocoupler U4 having a light emitting diode connected in parallel with the drain and source terminals of the switch Q7 (e.g., MOSFET) is used to provide a first (pulldown) signal when the UDSSCB is in the blocking state (i.e., turned-OFF) and a second (high impedance) signal when the UDSSCB is in the conducting state (i.e., turned-ON).

The specific component symbols used in FIG. 5 are intended to show functionality of one UDSSCB SVAD embodiment. The solid-state switches and optocouplers can be implemented using a range of transistors types. The resistors can have fixed or variable resistances.

Multi-Directional Solid-State Circuit Breaker (MDSSCB)

According to various embodiments, a multi-directional solid-state circuit breaker (MDSSCB) may include at least three solid-state switches electrically connected to a common node.

The solid-state switches of the MDSSCB are configured to provide conduction and voltage blocking in at least three discrete electrical paths relative to the common node. The solid-state switches may be transistors each of which may have a source S, gate G and drain D, for instance. The transistors may be JFETs or MOSFETs, for instance. As shown, the connection at the common node comprises a common-source connection of the at least three solid-state switches. By selectively actuating or applying the solid-state switches, fault protection can be realized on multiple electrical paths or lines connected to the common node.

The solid-state switches may be positioned at different switch positions with respect to the common node forming discrete electrical paths relative to the common node, whether positioned individually or in parallel arrangements. In some instances, the switch positions may be spaced apart, in a substantially equal fashion, angularly about the common node.

Figure 6:
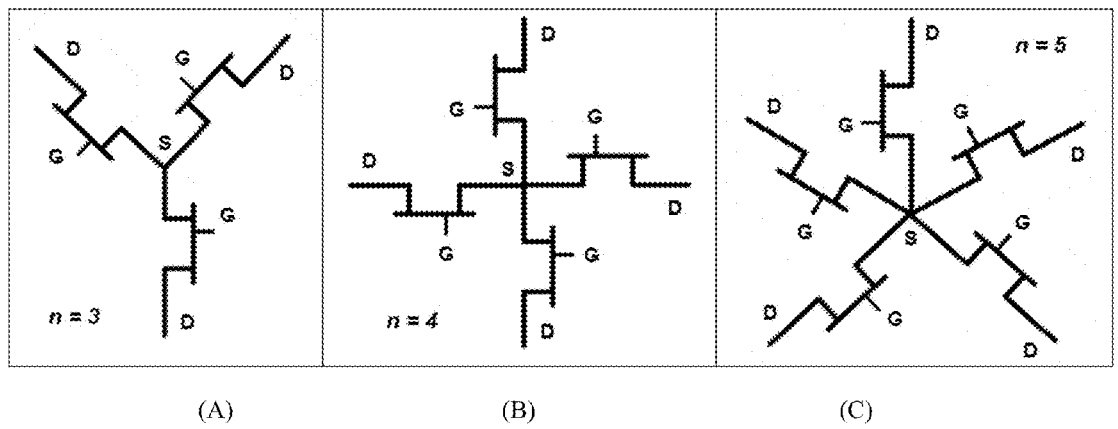
FIGS. 6A-C show examples of MDSSCBs according to various embodiments.

FIG. 6 shows examples of MDSSCBs having 3 (FIG. 6A), 4 (FIG. 6B), and 5 (FIG. 6C) switch positions, where solid-state switches are connected by a common node S according to various embodiments. While a single switch is illustrated at each of the switch positions in FIGS. 6(A)-(C), it will be appreciated that a plurality of switches may be provided at the same switch positions, with the plurality of switches being connected in a parallel arrangement. This parallel arrangement enables additional current conducting capability, and/or reduction in total ON-state resistance. Embodiments having even more switch positions are also possible.

In general, for an MDSSCB having n number of switch positions, current may be conducted and voltage blocked in any of a number of discrete electrical paths given by the expression n (n−1) by controlling the individual switches. Embodiments of the MDSSCB may be used for charge balancing in a parallel array in battery cells, for example.

In some embodiments, the common-source configuration may be chosen as depicted in FIGS. 6A-C. Although, it should be appreciated that a common-drain configuration at the common node may be used in other embodiments.

BDSSCB Test Example

To evaluate the BDSSCB SVAD circuit shown in FIG. 4, the inventor conducted testing. The BDSSCB tested included two SemiSouth SJDP120R085 normally-ON 1200-V SiC JFETS in common-source configuration. It also included an array of transient voltage suppression diodes to clamp device voltage at turn-OFF The BDSSCB tested was designed to support up to a 100-A rated switch stage, and was packaged with a footprint area of 32.2 cm$^2$ (5.0 in$^2$).

The BDSSCB SVAD tested was configured to provide both internal (self) and external triggering capabilities. It also has a reset line to return the BDSSCB to its default directional conducing state. When triggered to the bidirectional blocking state by the SVAD, the BDSSCB latches or actuates, i.e., one or both of the power switches is turned OFF. The BDSSCB SVAD provides self trigger (i.e., turn-OFF) voltage drop and response time, and provides for adjustable self trigger currents. It includes features, such as driving capability, power stage, and footprint area. In some embodiments, the BDSSCB SVAD can maintain OFF-state control during the reset interval, reduce reset time, and provide a BDSSCB status output. The reset function was improved with the goal of supporting a pre-charging operation for a capacitive system. An open collector status was output to indicate the state (ON/OFF) of the circuit breaker.

Figure 7:
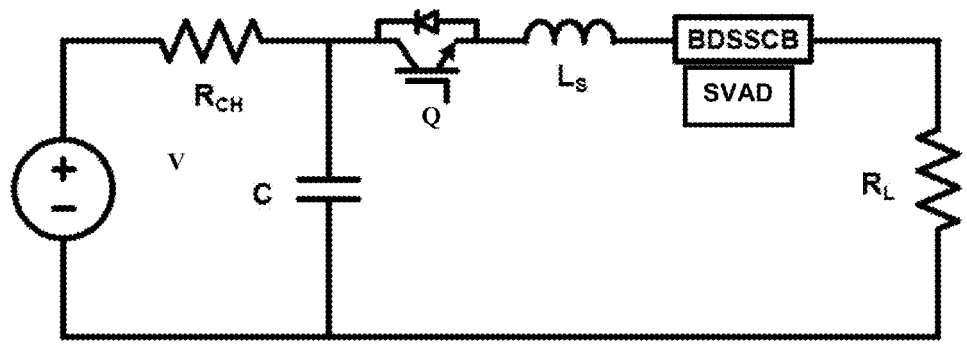
FIG. 7 illustrates a schematic of a pulse current test circuit that was used by the inventor for evaluation of the BDSSCB and SVAD.

FIG. 7 illustrates a schematic of a pulse current test circuit that was used for evaluation of the BDSSCB and SVAD. The test circuit shown includes a capacitor C that is charged through a resistor $R_{CH}$ by a DC power source V up to a nominal voltage of about 600V. The BDSSCB current pulse is gated-on via a solid-state switch Q formed of an insulated-gate bipolar transistor (IGBT) and an anti-parallel diode, to initiate a current pulse through inductor $L_S$, the BDSSCB and the resistive load $R_L$. The time constant of the capacitor C and the load resistor $R_L$ is large enough to provide nearly constant current pulse amplitude during the trip response time interval of the BDSSCB. With the load resistance fixed, pulse current is varied between tests by the source voltage. The BDSSCB polarity is reversible in the test circuit for bidirectional evaluation. As tested, the pulse current test circuit had a 16.7-0 resistive load $R_L$ and a 16-pH series inductor $L_S$ to model line inductance.

Figure 8:
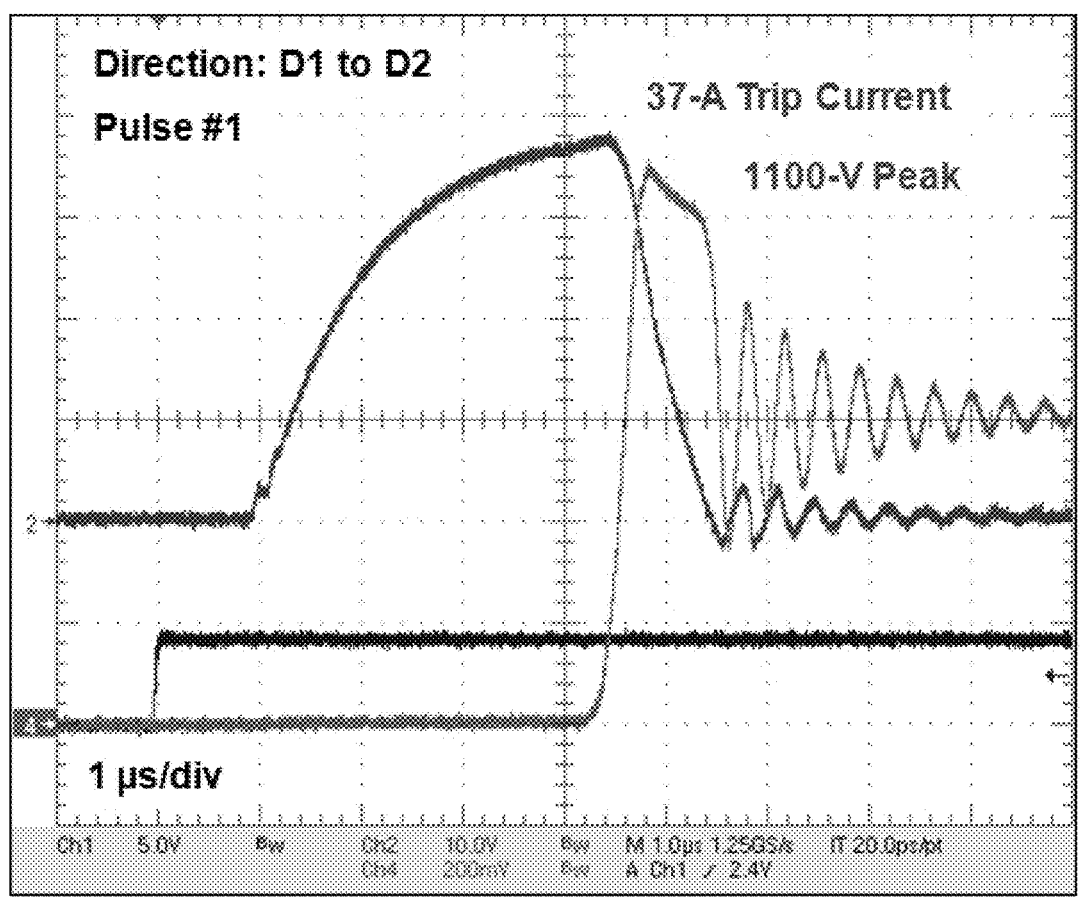
FIGS. 8A-D shows symmetric bidirectional BDSSCB pulse current and terminal voltage waveforms for self triggering.
Figure 8:
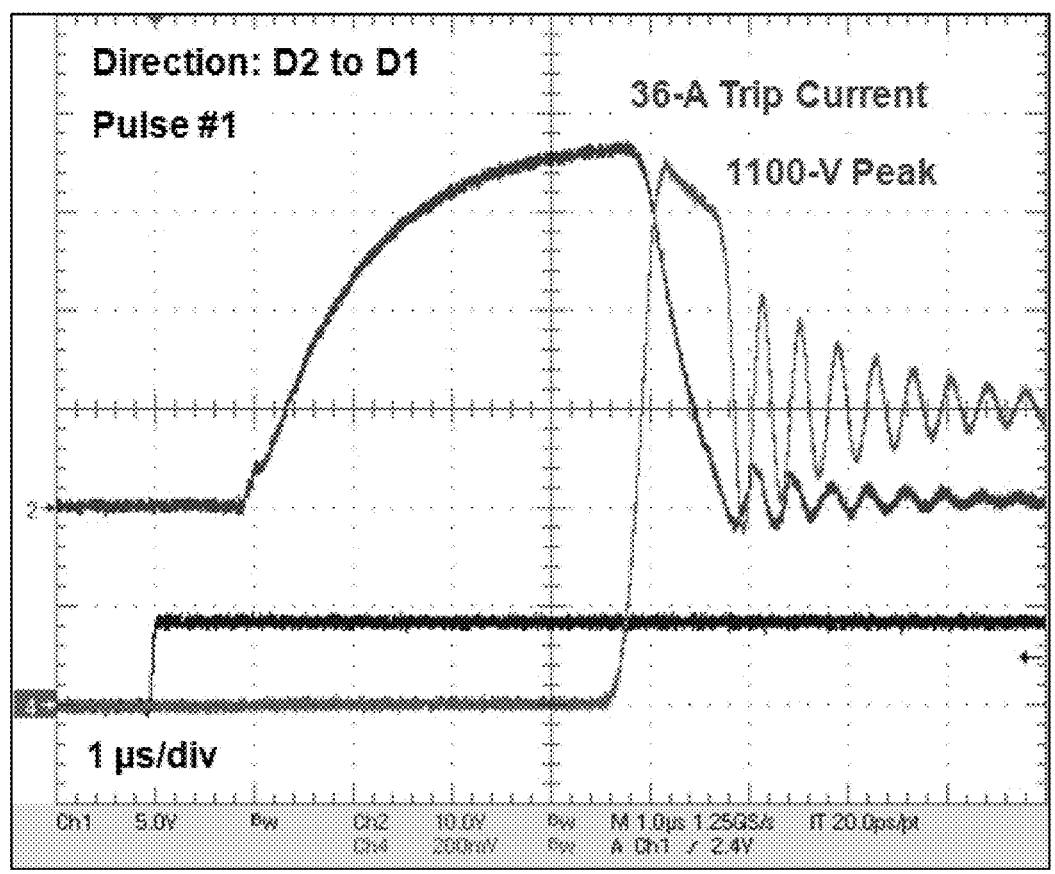
Figure 8:
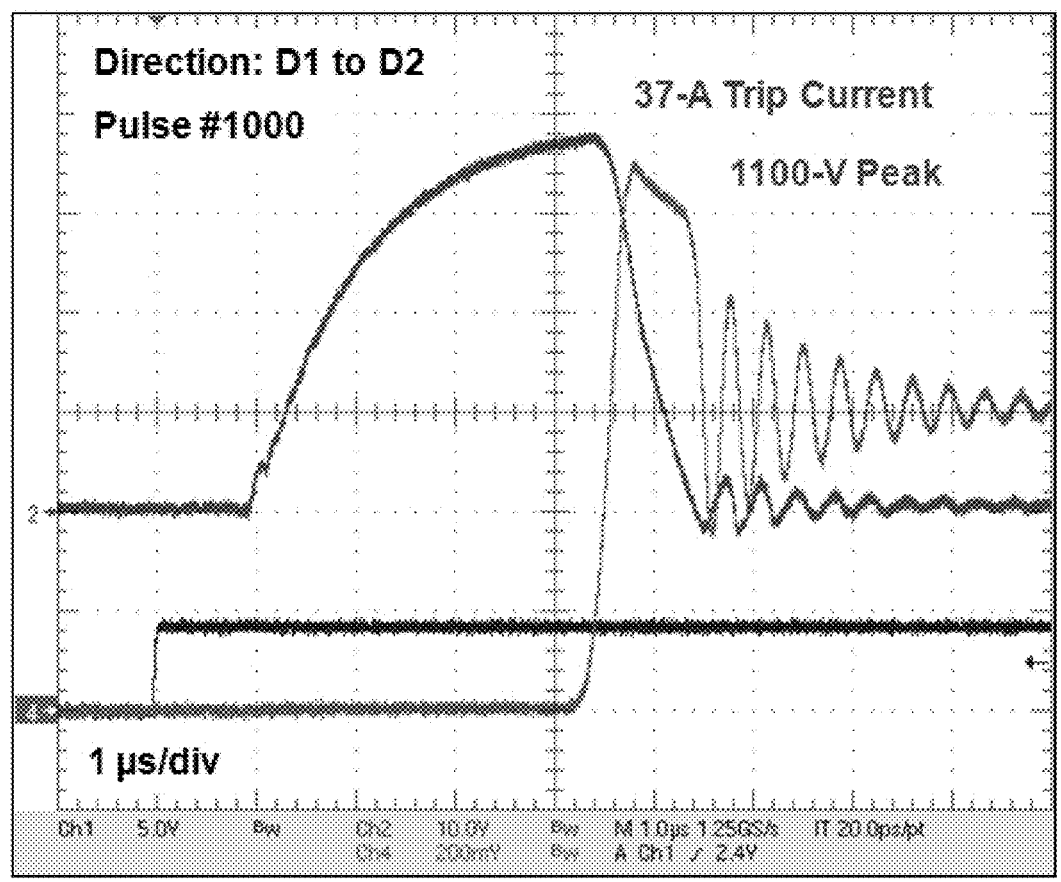
Figure 8:
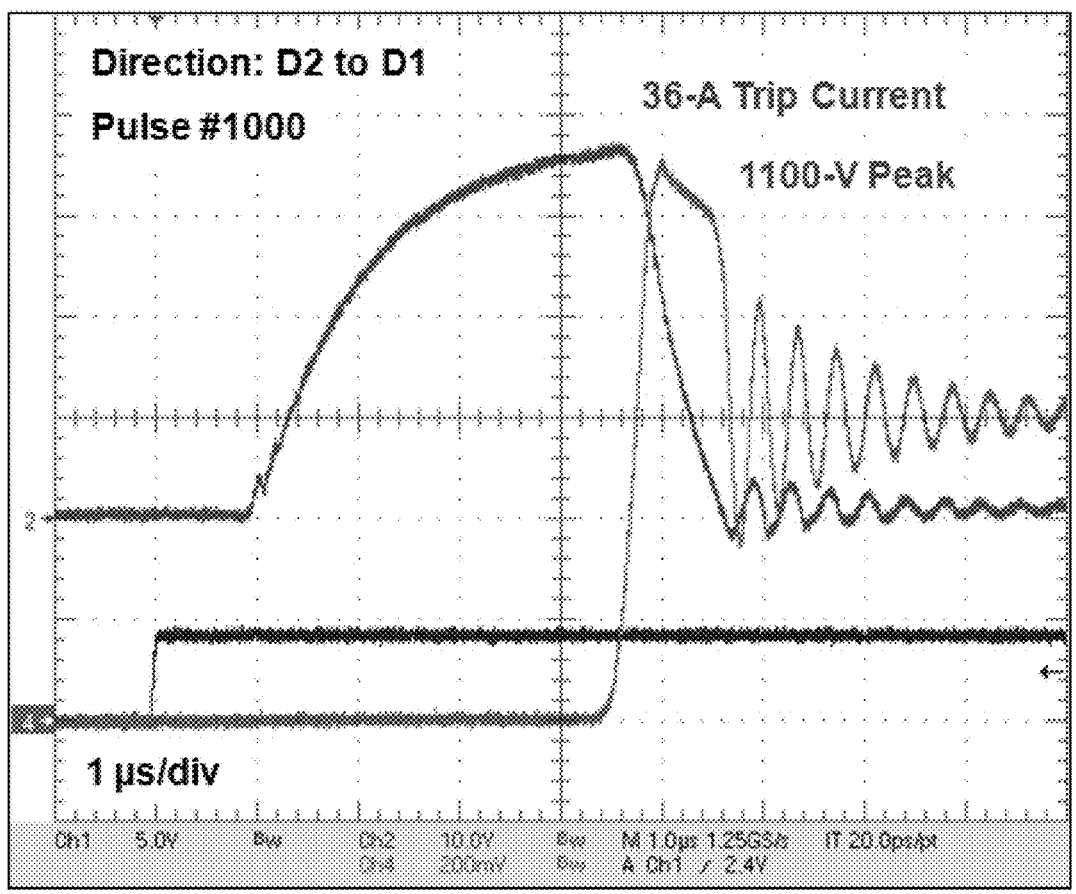

FIGS. 8A-D shows symmetric bidirectional BDSSCB pulse current and terminal voltage waveforms for self triggering with current flow from D1 to D2 and D2 to D1. FIG. 8A shows a BDSSCB 3.6-µs wide current pulse D1 to D2, 600-V, 37-A turn-off, and FIG. 8B shows a BDSSCB 3.9-µs wide current pulse D2 to D1, 600-V, 36-A turn-off (in which, Channel 1: IGBT turn-on signal, Channel 2: BDSSCB pulse current, Channel 4: BDSSCB voltage drop). Following the self-triggering characterization over a range of pulsed currents, repetitive self triggering tests were conducted. A nominal 600 V source was used to provide a total of 1000 peak trip current amplitudes of 37 A in each direction (D1 to D2 and D2 to D1) through the BDSSCB.

FIG. 8C shows a BDSSCB 3.6-µs wide current pulse #1000, D1 to D2, 600-V, 37-A turn-off, and FIG. 8D shows a BDSSCB 3.8-µs wide current pulse #1000, D2 to D1, 600-V, 36-A turn-off (in which, Channel 1: IGBT turn-on signal, Channel 2: BDSSCB pulse current, Channel 4: BDSSCB voltage drop). The time between the start of each current pulse was 5 s, and the reset signal was initiated 0.5 s from the start of each current pulse. The 1000$^{th}$ peak trip waveform was nearly identical to the first in both directions.

The results show that the BDSSCB SVAD provides faster reset response, such as, less than 5 µs, in order to provide improved system pre-charge capability. Additionally, further reduction in the self triggered BDSSCB turn-OFF response time can be implemented.

It is believed that BDSSCB tested can further be adapted to provide approximately twice the current rating if the power switches Q1, Q2 in FIG. 4 are replaced with SemiSouth SJDP120R045 SiC JFETs, for instance. Use of additional parallel connected power switches, such as a SiC JFET or SiC MOSFET, is also believed to provide even higher current BDSSCB operation (e.g., several times the current capability), with no increase in BDSSCB footprint area and roughly the same package height). On a 600 V bus, the BDSSCB power switches may be rated for system power levels exceeding 20 kW.

The BDSSCB embodiments described herein provide a versatile high-speed, high-reliability alternative to electro-mechanical switching devices. Its full four-quadrant operation makes it applicable to both AC and DC systems. Self triggered turn-OFF response times were reduced to less than 10 µs, with further reductions possible. BDSSCB reset time has also been reduced to facilitate a system pre-charge function. Although the BDSSCBs have been designed for up to 600-V applications, the maximum blocking voltage rating has been increased to 800 V.

Figure 9:
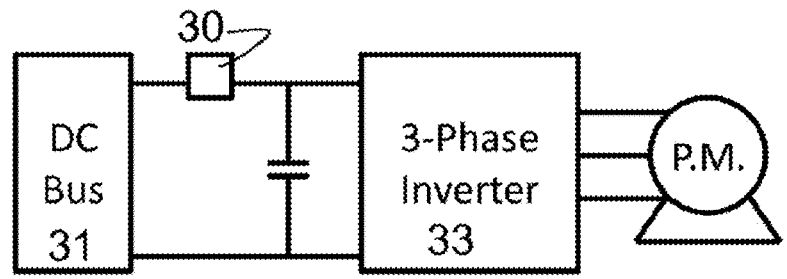
FIG. 9 schematically depicts an application of a BDSSCB connected between a DC bus and a 3-phase inverter.
Figure 10:
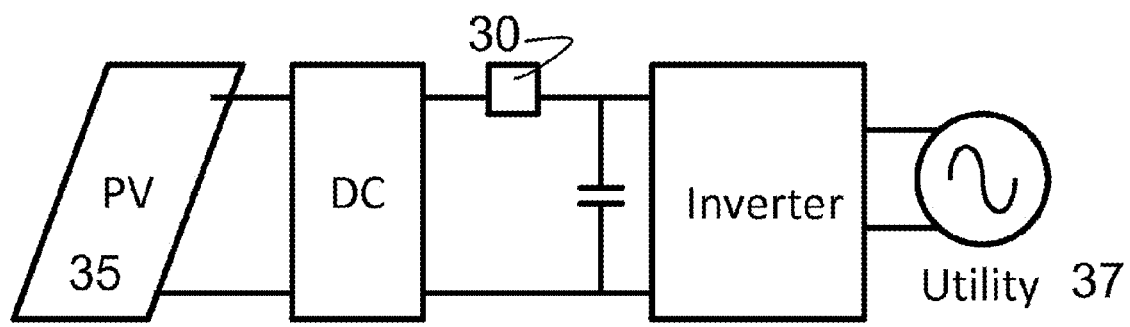
FIG. 10 illustrates an application of a BDSSCB used in conjunction with connection of a photovoltaic source to a utility.
Figure 11:
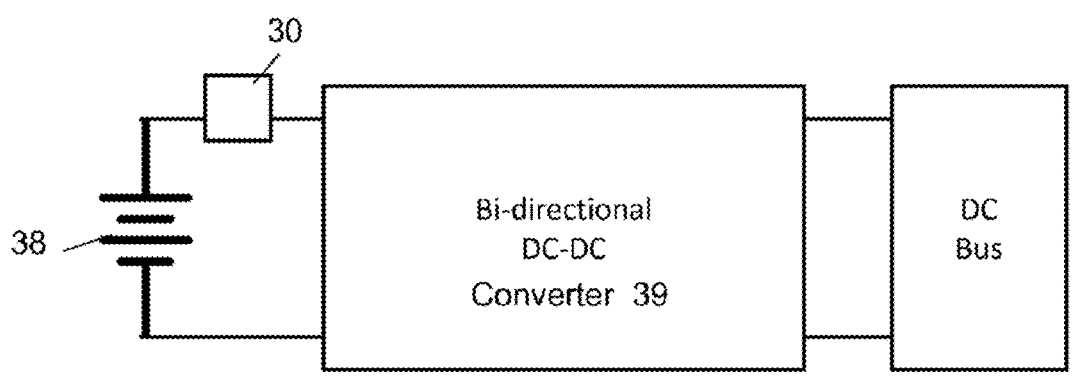
FIG. 11 illustrates an application of a BDSSCB used in conjunction with the connection of a battery source to a bidirectional DC-DC converter.

As depicted in FIGS. 9-11, embodiments of the invention (s) described herein may be used in: Hybrid electric vehicle systems; Grid-tie renewable energy inverter systems; Bidirectional DC-DC converters; Charge and discharge of energy storage systems; and Regenerative power (brakes, elevators, etc.), for instance.

FIG. 9 schematically depicts an application of the BDSSCB 30 connected between a DC bus 31 and a 3-phase inverter 33.

FIG. 10 illustrates an application of the BDSSCB 30 used in conjunction with connection of a photovoltaic source 35 to a utility 37.

FIG. 11 illustrates an application of the BDSSCB 30 used in conjunction with the connection of a battery source 38 to a bidirectional DC-DC converter 39.

The BDSSCB applications include, for example, distributed and off-grid power systems and hybrid-electric ground vehicle power systems, power electronic converters and power distribution equipment operating at up to several hundred volts and up to hundreds of kilowatts. To prevent damage to converters or other system components during fault conditions, fault current interrupt speeds in tens to hundreds of microseconds can be necessary. In many of these systems, AC and DC power components operate between two voltage busses having independent sourcing capability, and require bidirectional fault isolation. Such conditions can require fault protection systems having symmetric ratings for bidirectional voltage blocking in the OFF-state and bidirectional current conduction in the on-state. Mechanical contactors do not provide adequate actuation speeds in many applications, and suffer severe degradation during repeated fault isolation. A BDSSCB, as described in the foregoing, overcomes these deficiencies.

While the foregoing is directed to certain embodiments of the present invention(s), other and further embodiments of the invention(s) may be devised without departing from the basic scope thereof.

The invention claimed is:

1. A bidirectional solid-state circuit breaker (BDSSCB), the BDSSCB comprising: a pair of solid-state switches, each of said solid-state switches having a source, gate and drain, the pair of solid-state switches being electrically connected at a common node, the pair of solid-state switches configured to operate in a normally on mode to conduct current and to be switched off with a bipolar gate current actuation signal causing current flow to cease through one or both of the pair of solid-state switches; and a pair of diodes, each of the diodes electrically connecting the gate and either the drain or the source of a respective one of said solid-state switches which is not connected to the common node, wherein the pair of diodes have a lower forward voltage drop during conduction than that of the corresponding gate-to-drain or gate-to-source junctions of the pair of solid-state switches, thereby reducing the conduction current level at which the bipolar gate current actuation of the one or both of the pair of solid-state switches would occur without the diodes present.

2. The BDSSCB of claim 1, wherein the solid-state switches are electrically connected in a common-source configuration or in a common-drain configuration at the common node.

3. The BDSSCB of claim 2, wherein the solid-state switches are electrically connected in a common-source configuration at the common node such that the diodes each comprises an anode and cathode, the cathodes of the being connected to the drains of the respective ones of said solid-state switches and the anodes of the diodes being connected to the gates of the respective ones of said solid-state switches.

4. A shunt voltage actuated driver (SVAD) circuit for use with a bidirectional solid-state circuit breaker (BDSSCB) having a pair of solid-state power switches, each of said solid-state power switches having a source, gate and drain, wherein the sources of the solid-state power switches are electrically connected to a common node, the SVAD comprising:

a voltage triggered module configured to connect to said solid-state power switches and the common node of the BDSSCB, the voltage triggered module comprising: a first pair of solid-state switches, each of the solid-state switches having a source, gate and drain, the drains of the solid-state switches being configured to electrically connect to one of the respective drains of the pair of solid-state power switches of the BDSSCB; and a plurality of shunt resistors in series electrically connecting the first pair of solid-state switches, and being configured to electrically connect to the common source node of the BDSSCB, wherein the first pair of solid-state switches of the voltage triggered module each have a blocking voltage greater than or equal to that of the respective solid-state power switch of the BDSSCB; and a voltage sensing and actuation module connected to the voltage triggered module comprising:

a second pair of solid-state switches;

one or more shunt resistors configured to generate resistance to enable the BDSSCB to turn off current flow in one or both directions through the BDSSCB, each of the one or more shunt resistors being configured to electrically connect to the common node of the BDSSCB and to a respective one of the second pair of solid-state switches; and a third pair of solid-state switches, wherein one or both of the second pair of solid-state switches is configured to turn on and hold the on-state so long as sufficient voltage is present across the one or more shunt resistors thus turning on and holding one or both of the third pair of solid-state switches in the on-state which turns off one or both of the first pair of solid-state switches, thereby ceasing current flow in one or both directions through one or both of the pair of solid-state power switches of the BDSSCB.

5. The SVAD of claim 4, further comprising a voltage isolated external triggering module configured to turn off the BDSSCB having:

a fourth pair of solid-state switches configured to turn on the pair of solid-state switches of the BDSSCB;

an inverter; and an optocoupler connected to the inverter configured to turn on both of the fourth pair of solid-state switches.

6. The SVAD of claim 5, further comprising a voltage isolated reset module having:

a fifth pair of solid-state switches configured to turn off the third pair of solid-state switches; and a second optocoupler connected through one or more resistors to a respective one of the fifth pair of solid-state switches configured to stop the flow of current through both of the fifth pair of solid-state switches.

7. The SVAD of claim 6, further comprising an isolated fault status module having:

one or more sixth solid-state switches configured to provide a digital feedback signal indicating the state of the BDSSCB; and an third optocoupler having a light emitting diode connected to the one or more sixth solid-state switches configured to indicate said status.

8. An electrical device comprising: a bidirectional solid-state circuit breaker (BDSSCB) having a pair of solid-state power switches, each of said solid-state power switches having a source, gate and drain, wherein the sources of the solid-state power switches are electrically connected to a common node; and the SVAD of claim 4.

9. An electrical device comprising:
the bidirectional solid-state circuit breaker (BDSSCB) of claim 1; and
a bipolar current actuated driver (BCAD) connected to the BDSSCB, the BCAD comprising: one or more series resistors;
a first pair of solid-state switches, each of said solid-state switches having a drain, gate, and source, with the drain being connected to the one or more series resistors and the source being configured to connect to the common node of the BDSSCB,
wherein the one or more series resistors connected to the first pair of solid-state switches are also configured to connect to a respective gate of one of the solid-state power switches of the BDSSCB.

10. The BDSSCB of claim 1, further comprising one or more additional pairs of diodes connected in parallel with the pair of diodes to the corresponding gate-to-drain or gate-to-source junctions of the pair of solid-state switches.

11. The BDSSCB of claim 10, wherein different one of the pairs of the diodes are selected to enable triggering of one or both of the pair of solid-state switches off at different currents or temperatures.

12. The SVAD of claim 4, further comprising: a DC power source having a positive terminal electrically connected to the common node of the BDSSCB and the second pair of solid-state switches and a negative terminal electrically connected to the third pair of solid-state switches.

13. The electrical device of claim 9, wherein the BDSSCB further comprises: a pair of diodes connected in series between the drains of the pair of solid-state switches of the BDSSCB.

14. The electrical device of claim 9, wherein the BCAD further comprises:
a second pair of solid-state switches, each of the second pair of solid-state switches being configured to electrically connect with the common-node and the resistors, such that when sufficient voltage is present across the one or more resistors, the second pair of solid-state switches is turned on.

15. The electrical device of claim 14, wherein the BCAD further comprises:
a third pair of solid-state switches, each of said solid-state switches operable connected to the second pair of solid-state switches, such that when either of the second pair of solid-states switches turns on it will turn on a corresponding one of the third pair of solid-state switches which in turn triggers the other of the second pair of solid-state switch as well as the other of third pair of solid-state switches.

* * * * *